US012672530B2

(12) United States Patent
Lin et al.

(10) Patent No.: US 12,672,530 B2
(45) Date of Patent: Jun. 30, 2026

(54) ELECTRONIC PACKAGE

(71) Applicant: Advanced Semiconductor Engineering, Inc., Kaohsiung (TW)

(72) Inventors: Hung-Yi Lin, Kaohsiung (TW); Cheng-Yuan Kung, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 1120 days.

(21) Appl. No.: 17/715,876

(22) Filed: Apr. 7, 2022

(65) Prior Publication Data

US 2023/0326889 A1     Oct. 12, 2023

(51) Int. Cl.
H10W 20/20 (2026.01)
H10W 90/00 (2026.01)
H10W 74/15 (2026.01)

(52) U.S. Cl.
CPC ........... H10W 20/20 (2026.01); H10W 90/00 (2026.01); *H10W 74/15* (2026.01); *H10W*

*90/724* (2026.01); *H10W 90/734* (2026.01); *H10W 90/792* (2026.01)

(58) Field of Classification Search
CPC ....... H01L 25/0652; H01L 2224/08145; H01L 2924/1432; H10W 20/20; H10W 90/00; H10W 74/15
See application file for complete search history.

(56) References Cited

U.S. PATENT DOCUMENTS

| | | | |
|---|---|---|---|
| 7,843,302 B2 | 11/2010 | Mano et al. | |
| 2021/0391267 A1 * | 12/2021 | Kaeding | ............... H01L 25/167 |
| 2023/0069261 A1 * | 3/2023 | Simsek-Ege | ........ H01L 23/5384 |

* cited by examiner

*Primary Examiner* — Errol V Fernandes
(74) *Attorney, Agent, or Firm* — Foley and Lardner LLP

(57) ABSTRACT

An electronic package is provided. The electronic package includes a processing component and a memory unit. The processing component has a side including a first region and a second region distinct from the first region. The memory unit is disposed over the first region. The first region is configured to provide interconnection between the processing component and the memory unit, and the second region is configured to provide external connection.

15 Claims, 21 Drawing Sheets

<u>1</u>

ELECTRONIC PACKAGE

BACKGROUND

1. Technical Field

The present disclosure relates generally to an electronic package.

2. Description of the Related Art

As electronic packages are miniaturized, the number of transistors in a single chip (or processor) increases significantly. In addition, as conductive bumps and pitches continue to be reduced in size, the difficulty of assembly can increase, the relatively high circuit density on the chip (or processor) may cause serious interference, and reduced circuit widths can accelerate losses in signal and power transmission.

SUMMARY

In some embodiments, an electronic package includes a processing component and a memory unit. The processing component has a side including a first region and a second region distinct from the first region. The memory unit is disposed over the first region. The first region is configured to provide interconnection between the processing component and the memory unit, and the second region is configured to provide external connection.

In some embodiments, an electronic package includes a processing component and a memory unit. The processing component has a first surface and a second surface opposite to the first surface. The processing component is configured to transmit a digital signal through the first surface and receive a power through the second surface. The memory unit is on the first surface of the processing component.

In some embodiments, an electronic package includes a first carrier, a second carrier, and an assembly structure. The second carrier is disposed over the first carrier. The assembly structure is disposed between the first carrier and the second carrier. The assembly structure includes a processing unit, a storage unit, and a connection structure. The processing unit is configured to receive a power signal from the first carrier into the processing unit. The storage unit is stacked on the processing unit. The connection structure extends along a lateral side of the storage unit and configured to transmit a non-power signal from the processing unit to the second carrier.

BRIEF DESCRIPTION OF THE DRAWINGS

Aspects of the present disclosure are best understood from the following detailed description when read with the accompanying drawings. It is noted that various features may not be drawn to scale, and the dimensions of the various features may be arbitrarily increased or reduced for clarity of discussion.

DETAILED DESCRIPTION

Figure 1A:
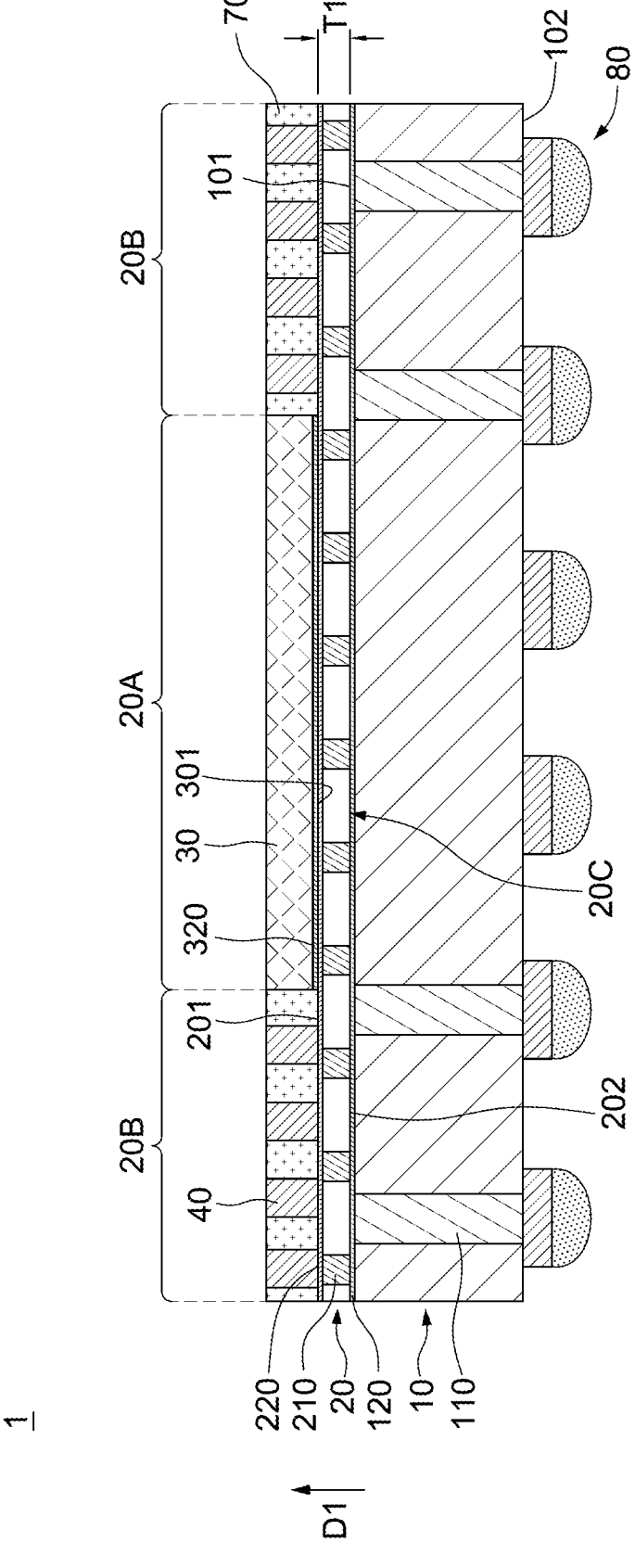
FIG. 1A is a cross-section of an electronic package in accordance with some embodiments of the present disclosure.

FIG. 1A is a cross-section of an electronic package 1 in accordance with some embodiments of the present disclosure. The electronic package 1 includes a carrier 10, a processing component 20, a memory unit 30, connection structures 40, 110, and 210, a protective element 70, and electrical contacts 80.

The carrier 10 may have a surface 101 and a surface 102 opposite the surface 101. In some embodiments, the carrier 10 supports a processing component 20. In some embodiments, the carrier 10 supports a passive surface or backside surface (e.g. surface 202) of the processing component 20. In some embodiments, the carrier 10 includes a capacitor, a power regulating component, or a combination thereof. In some embodiments, the carrier 10 is or includes a deep trench capacitor (DTC). In some other embodiments, the carrier 10 includes an integrated component including a power regulating component and one or more passive components. The power regulating component may include a voltage regulating element, such as a linear regulator (configured to maintain a constant output voltage) or a switching regulator (configured to generate an output voltage higher than or lower than the input voltage). The power regulating component may include a step-down (buck) converter, a step-up (boost) converter, an analog-to-digital converter, a digital-to-analog converter, an AC-DC converter, a DC-DC converter, other types of converters, or a combination thereof. The one or more passive components may be or include one or more inductance devices (or inductors) and/or one or more capacitance devices (or capacitors) integrated with the voltage regulating element and/or the converter.

The one or more passive components may further include one or more passive devices including, for example, resistors, diodes, fuses, antifuses, etc. In some embodiments, the carrier 10 includes a conductive layer 120 (e.g., a redistribution layer (RDL) or a circuit region) adjacent to the surface 101 of the carrier 10.

The electronic package 1 may include one or more connection structures 110. In some embodiments, the connection structure 110 is on the passive surface or backside surface (e.g. the surface 202) of the processing component 20. In some embodiments, the connection structure 110 is electrically connected to the processing component 20. In some embodiments, the connection structure 110 is configured to carry power (e.g., voltage). In some embodiments, the connection structure 110 is further configured to dissipate heat from the processing component 20. In some embodiments, the connection structure 110 passes through or penetrates the carrier 10. In some embodiments, the connection structure 110 includes a conductive via, such as a through silicon via (TSV). According to some embodiments of the present disclosure, the carrier 10 with the connection structures 110 may be a DTC with TSVs and serve to provide vertical power decoupling function.

The processing component 20 (also referred to as "the processing unit") may have a surface 201 (also referred to as "an active surface") and a surface 202 (also referred to as "a passive surface" or "a backside surface") opposite the surface 201. In some embodiments, the processing component 20 is configured to transmit or receive a digital signal through the surface 201 (or the active surface) and receive power through the surface 202 (or the passive surface). In some embodiments, the processing component 20 includes an active element 220 (e.g., a circuit region) adjacent to the surface 201 of the processing component 20. The active element 220 may be configured to transmit or receive the digital signal. In some embodiments, the processing component 20 has a thickness T1 less than about 20 μm, less than about 15 μm, or less than about 10 μm. In some embodiments, the processing component 20 may be a thinned processing component adhered to a DTC (e.g., the carrier 10) with TSVs (e.g., the connection structures 110) and transmitting power through the TSVs in the DTC. In some embodiments, the carrier 10 is configured to not only provide power but also support the thinned processing component 20.

In some embodiments, the processing component 20 has a side (also referred to as "a first side") (e.g., the surface 201) including a region 20A, a region 20B distinct from the region 20A, and a region 20C opposite to the regions 20A and 20B. In some embodiments, the region 20C is at another side (also referred to as "a second side") (e.g., the surface 202) opposite to the first side of the processing component 20. In some embodiments, the regions 20A and 20B are adjacent to the surface 201 (or the active surface) of the processing component 20, and the region 20C is adjacent to the surface 202 (or the passive surface) of the processing component 20. In some embodiments, the regions 20A and 20B are closer to the surface 201 (or the active surface) than to the surface 202 (or the passive surface). In some embodiments, the surface 201 (or the active surface) includes the regions 20A and 20B. In some embodiments, the region 20A separates the region 20B into two portions. In some embodiments, the active element 220 includes the regions 20A and 20B. In some embodiments, the connection structure 110 is on the region 20C of the processing component 20.

In some embodiments, the region 20A of the processing component 20 is configured to provide interconnection between the processing component 20 and the memory unit 30. In some embodiments, the region 20B of the processing component 20 is configured to provide external connection. In some embodiments, the region 20C of the processing component 20 is configured to receive power into the processing component 20. In some embodiments, a digital signal is transmitted between the processing component 20 and the memory unit 30 and between the region 20A and the region 20B of the processing component 20. In some embodiments, a power path configured to transmit power passes through or penetrates the connection structure 110, the capacitor of the carrier 10, and the processing component 20, sequentially. In some embodiments, a power path configured to transmit power passes through or penetrates the connection structure 110, the power regulating component of the carrier 10, and the processing component 20, sequentially.

In some embodiments, the processing component 20 may include, for example, a central processing unit (CPU), a microprocessor unit (MPU), a graphics processing unit (GPU), a microcontroller unit (MCU), an application-specific integrated circuit (ASIC), a field-programmable gate array (FPGA), or another type of integrated circuit. In some embodiments, the processing component 20 may include one or more processing elements and one or more memory elements electrically connected to the processing elements. The processing element(s) and the memory element(s) may be divided from or originate in a monolithic processing unit (e.g., a CPU, a MPU, a GPU, a MCU, an ASIC, or the like). In some embodiments, the processing element may be a CPU chiplet, a MCU chiplet, a GPU chiplet, an ASIC chiplet, or the like. The memory element may be a cache memory. In some embodiments, a wafer node of the processing element is less or smaller than a wafer node of the memory element. In some embodiments, a wafer node of the processing element may lead a wafer node of the memory element by one or more generations. For example, the processing element may be a 5 nm or less node wafer, such as a 3 nm or less node wafer, a 2 nm or less node wafer, or less; and the memory element may be a 20 nm or more node wafer, such as a 28 nm or more node wafer, a 32 nm or more node wafer, or greater.

In some embodiments, the processing component 20 may further include one or more connection elements (also referred to as "connection chiplets"). The connection elements may be I/O (input/output) elements (also referred to as "I/O chiplets").

The electronic package 1 may include one or more connection structures 210. In some embodiments, the connection structure 210 is on the region 20B of the processing component 20. In some embodiments, the connection structure 210 is configured to carry power. In some embodiments, the connection structure 210 extends from the surface 202 to the surface 201 and configured to transmit the power. In some embodiments, the connection structure 210 passes through or penetrates the processing component 20. In some embodiments, the connection structure 210 includes a conductive via, such as a TSV. In some embodiments, a diameter of the connection structure 110 is greater than or exceeds a diameter of the connection structure 210. In some embodiments, the connection structures 210 may serve as high-density terminals for transmitting the digital signal.

The memory unit 30 (also referred to as "the storage unit") may be disposed over the surface 201 (or the active surface) of the processing component 20. In some embodiments, the memory unit 30 is adjacent to the surface 201 of the processing component 20. In some embodiments, the memory unit 30 is disposed over the region 20A of the processing component 20. In some embodiments, the memory unit 30 covers the region 20A and does not cover the region 20B. In some embodiments, the memory unit 30 and the region 20B of the processing component 20 are non-overlapping in a direction D1 or along an orientation (i.e., the direction D1) substantially perpendicular to the surface 201 (or the active surface) of the processing component 20. In some embodiments, the memory unit 30 includes an active surface 301 hybrid-bonded to the surface 201 (or the active surface) of the processing component 20. In some embodiments, the active surface 301 of the memory unit 30 is bonded to the surface 201 (or the active surface) of the processing component 20 through a solder-free joint or a non-solder joint. In some other embodiments, the active surface 301 of the memory unit 30 is bonded to the surface 201 (or the active surface) of the processing component 20 through a solder joint (e.g., one or more solder balls). In some embodiments, the memory unit 30 includes an active element 320 (e.g., a circuit region) adjacent to the surface 301 of the memory unit 30. In some embodiments, the active element 320 of the memory unit 30 is bonded to the surface 201 (or the active surface) of the processing component 20 through a solder-free joint or a non-solder joint. In some embodiments, the memory unit 30 may be a cache memory. In some embodiments, a wafer node of the processing element of the processing component 20 is less than or smaller than a wafer node of the memory unit 30. In some embodiments, a wafer node of the processing element of the processing component 20 may lead a wafer node of the memory unit 30 by one or more generations. For example, the memory unit 30 may be a 20 nm or more node wafer, such as a 28 nm or more node wafer, a 32 nm or more node wafer, or greater. In some embodiments, the memory unit 30 is configured to provide additional memory capacity for the processing component 20 in addition to the built-in memory of the processing component 20.

The electronic package 1 may include one or more connection structures 40. In some embodiments, the connection structure 40 is on the region 20B of the processing component 20 and electrically connected to the processing component 20. In some embodiments, the connection structure 40 is on the surface 201 and configured to transmit the digital signal. In some embodiments, the connection structure 40 is configured to carry the digital signal through the surface 201. In some embodiments, the connection structure 40 extends along one or more lateral sides of the memory unit 30. In some embodiments, the connection structures 40 include a plurality of conductive pillars. The conductive pillars may be formed of or include copper (Cu). In some embodiments, a diameter of the connection structure 110 is greater than a diameter of the connection structure 40. In some embodiments, a pitch of the connection structures 40 is less than about 30 μm, less than about 25 μm, or less than about 20 μm.

The protective element 70 may be disposed on the processing component 20. In some embodiments, the protective element 70 covers or encapsulates at least a portion of the processing component 20. In some embodiments, the protective element 70 covers or encapsulates the memory unit 30. In some embodiments, the protective element 70 covers or encapsulates the connection structures 40. In some embodiments, the protective element 70 includes an encapsulant or a dielectric structure. The protective element 70 may include an epoxy resin including fillers, a molding compound (e.g., an epoxy molding compound or other molding compound), polyimide, a phenolic compound or material, a material including silicone dispersed therein, or a combination thereof.

The electrical contacts 80 may be disposed on the surface 102 of the carrier 10. In some embodiments, the electrical contact 80 (e.g. a solder ball) can electrically connect the electronic package 1 and external components (e.g. external circuits or circuit boards). In some embodiments, the electrical contacts 80 include controlled collapse chip connection (C4) bumps, a ball grid array (BGA), or a land grid array (LGA).

Figure 1B:
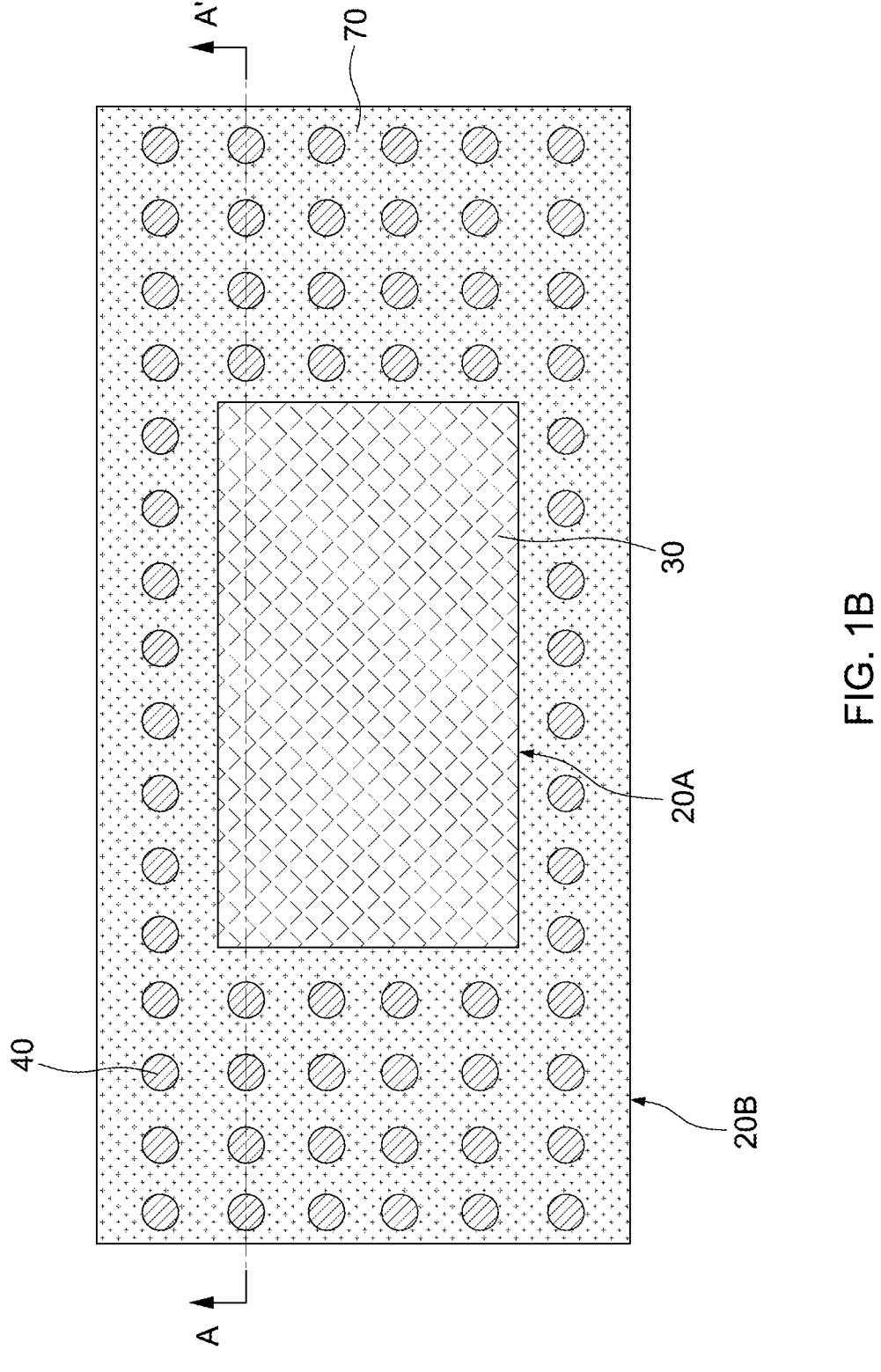
FIG. 1B is a top view of an electronic package in accordance with some embodiments of the present disclosure.

FIG. 1B is a top view of an electronic package 1 in accordance with some embodiments of the present disclosure. In some embodiments, FIG. 1A is a cross-section along the line A-A' in FIG. 1B.

In some embodiments, the region 20B surrounds the region 20A of the processing component 20. In some embodiments, the connection structures 40 surround the region 20A of the processing component 20. In some embodiments, the connection structures 40 surround the memory unit 30.

Figure 1C:
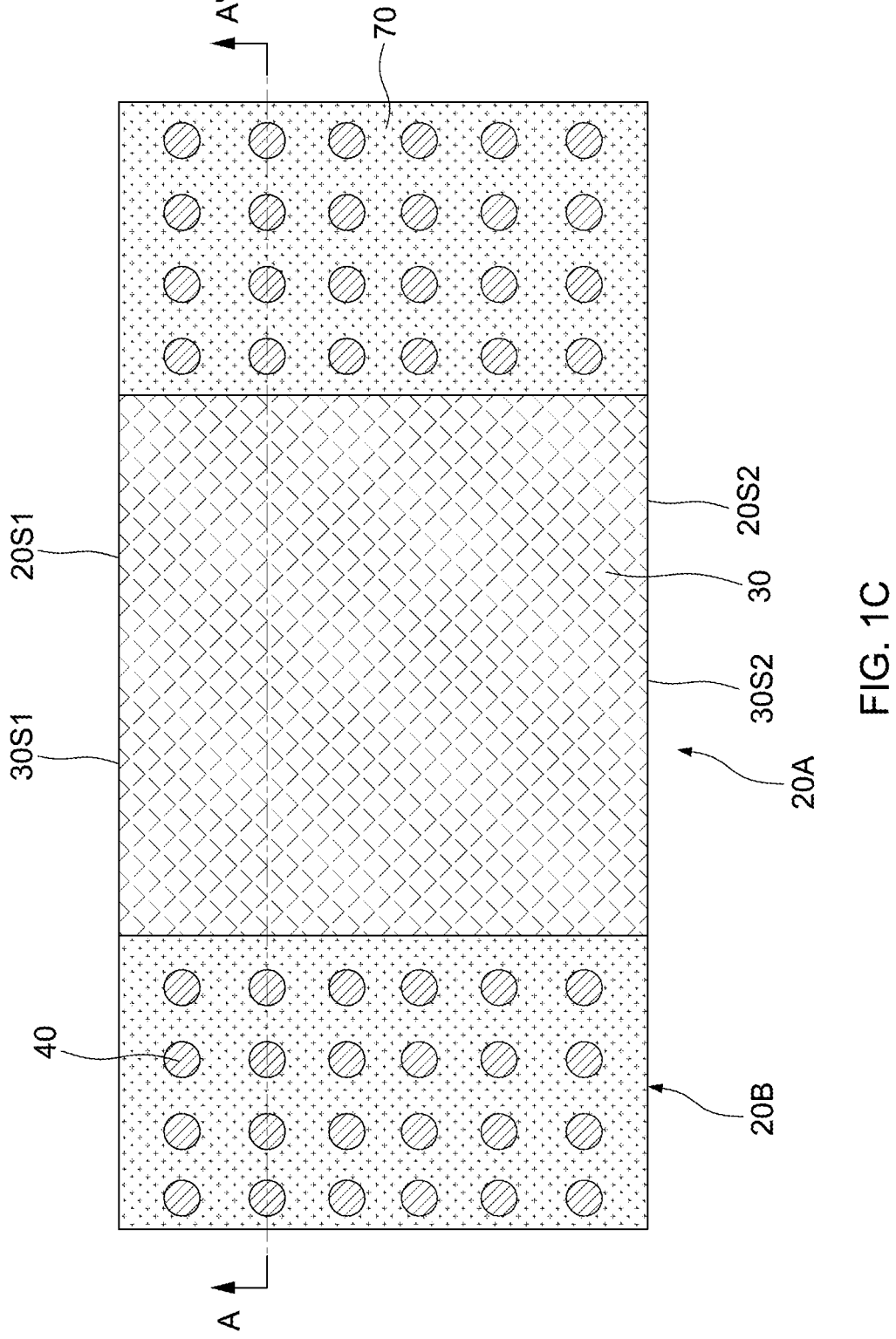
FIG. 1C is a top view of an electronic package in accordance with some embodiments of the present disclosure.

FIG. 1C is a top view of an electronic package 1 in accordance with some embodiments of the present disclosure. In some embodiments, FIG. 1A is a cross-section along the line A-A' in FIG. 1C.

In some embodiments, the region 20A separates the region 20B into two portions. In some embodiments, the connection structures 40 are located on the two portions of the region 20B of the processing component 20. In some embodiments, the connection structures 40 are located on opposite lateral sides of the memory unit 30. In some embodiments, the processing component 20 includes edges (also referred to as "lateral surfaces" or "lateral sides") 20S1 and 20S2, and the memory unit 30 extends from the edge 20S1 toward the edge 20S2. In some embodiments, the memory unit 30 includes edges (also referred to as "lateral surfaces" or "lateral sides") 30S1 and 30S2. In some embodiments, the edge 20S1 of the processing component 20 is substantially aligned with the edge 30S1 of the memory unit 30. In some embodiments, the edge 20S2 of the processing component 20 is substantially aligned with the edge 30S2 of the memory unit 30.

According to some embodiments of the present disclosure, the connection structures 40 and the memory unit 30 are bonded to the regions 20A and 20B of the active surface (i.e., the surface 201) of the processing component 20. Therefore, the connection structures 40 and the memory unit 30 are both vertically stacked on and bonded to the active surface of the processing component 20, and thus the transmission path (e.g., by vertical transmission) between the processing component 20 and the memory unit 30 can be significantly reduced as compared to the transmission path (e.g., by horizontal transmission) between a processing component and a memory unit arranged side-by-side. Accordingly, the resistance of the transmission path is reduced due to reduction of the transmission path, and interference is reduced as well.

In addition, according to some embodiments of the present disclosure, with the connection structures 40 and the memory unit 30 both vertically stacked on the active surface of the processing component 20, not only can the processing component 20 access the memory unit 20, but also transmit or receive a digital signal through the active surface (i.e., the surface 201). Therefore, the memory capacity of the electronic package 1 can be increased by the memory unit 30, and the device area of the electronic package 1 is significantly reduced.

In cases where a memory unit is integrated into a processing component during manufacture, the process for forming processing elements of the processing component demands increased precision (e.g., a relatively high processing precision), and thus the memory unit formed together with the processing elements also demands increased precision (e.g., a relatively high processing precision), which can increase process complexity as well as costs In contrast, according to some embodiments of the present disclosure, a wafer node of the processing element of the processing component 20 is less than or smaller than a wafer node of the memory unit 30, and the memory unit 30 is manufactured separately from the processing component 20 and then bonded to the active surface of the processing component 20. Therefore, the precision required for manufacturing the memory unit 30 is less than that for manufacturing the processing element of the processing component 20, and processes requiring different levels of processing precision are performed separately, simplifying overall process and reducing costs.

Moreover, according to some embodiments of the present disclosure, the memory unit 30 is hybrid-bonded to the active surface of the processing component 20, and/or the memory unit 30 is bonded to the active surface of the processing component 20 through a solder-free joint or a non-solder joint. Therefore, the resistance of the transmission path between the memory unit 30 and the processing component 20 is relatively low, which is advantageous to improving the access rate for the processing component 20.

Figure 2A:
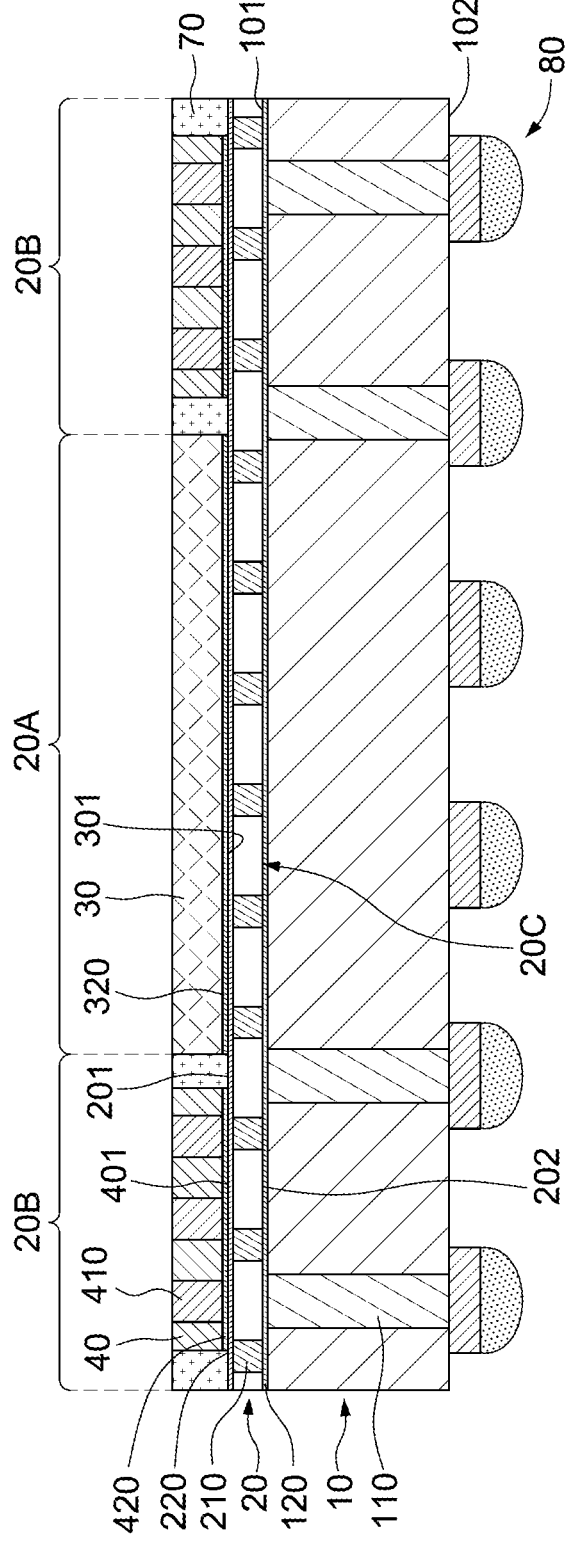
FIG. 2A is a cross-section of an electronic package in accordance with some embodiments of the present disclosure.

FIG. 2A is a cross-section of an electronic package 2 in accordance with some embodiments of the present disclosure. The electronic package 2 is similar to the electronic package 1 shown in FIG. 1A, with differences therebetween as follows. Descriptions of similar components are omitted.

In some embodiments, the connection structure 40 includes an active input/output (I/O) element. In some embodiments, the connection structure 40 includes an active surface 401 which is hybrid-bonded to the surface 201 (or the active surface) of the processing component 20. In some embodiments, the active surface 401 of the connection structure 40 is bonded to the surface 201 (or the active surface) of the processing component 20 through a solder-free joint or a non-solder joint.

In some embodiments, the connection structure 40 includes an active element 420 (e.g., a circuit region) adjacent to the surface 401 of the connection structure 40. In some embodiments, the connection structure 40 further includes additional active elements (e.g., transistors) connected to the active element 420. In some embodiments, the active element 420 of the connection structure 40 is hybrid-bonded to the surface 201 (or the active surface) of the processing component 20. In some embodiments, the active element 420 of the connection structure 40 is bonded to the surface 201 (or the active surface) of the processing component 20 through a solder-free joint or a non-solder joint. In some embodiments, the connection structure 40 further includes one or more conductive vias 410. In some embodiments, the connection structure 40 includes a silicon-based body, and the conductive vias 410 pass through or penetrate the silicon-based body. The conductive vias 410 may be electrically connected to the processing component 20 through the surface 201 of the processing component 20 and the surface 401 of the connection structure 40. In some embodiments, a pitch of the conductive vias 410 is less than about 30 μm, less than about 25 μm, or less than about 20 μm.

In some embodiments, the connection structure 40 may be or include an interposer (e.g., an active interposer). In some embodiments, the connection structure 40 may be or include a silicon-based interposer, and the conductive vias 410 may be TSVs. In some embodiments, the protective element 70 covers or encapsulates the connection structures 40. In some embodiments, a wafer node of the processing element of the processing component 20 is less than or smaller than a wafer node of the connection structure 40. In some embodiments, a wafer node of the processing element of the processing component 20 may lead a wafer node of the connection structure 40 by one or more generations. For example, the connection structure 40 may be a 20 nm or more node wafer, such as a 28 nm or more node wafer, a 32 nm or more node wafer, or greater. In some embodiments, the connection structure 40 may be divided from or originating from a monolithic processing unit (e.g., a CPU, a MPU, a GPU, a MCU, an ASIC, or the like) and configured to replace an I/O element presumably integrated in the processing component 20. In some embodiments, the connection structure 40 may be an I/O chiplet.

Figure 2B:
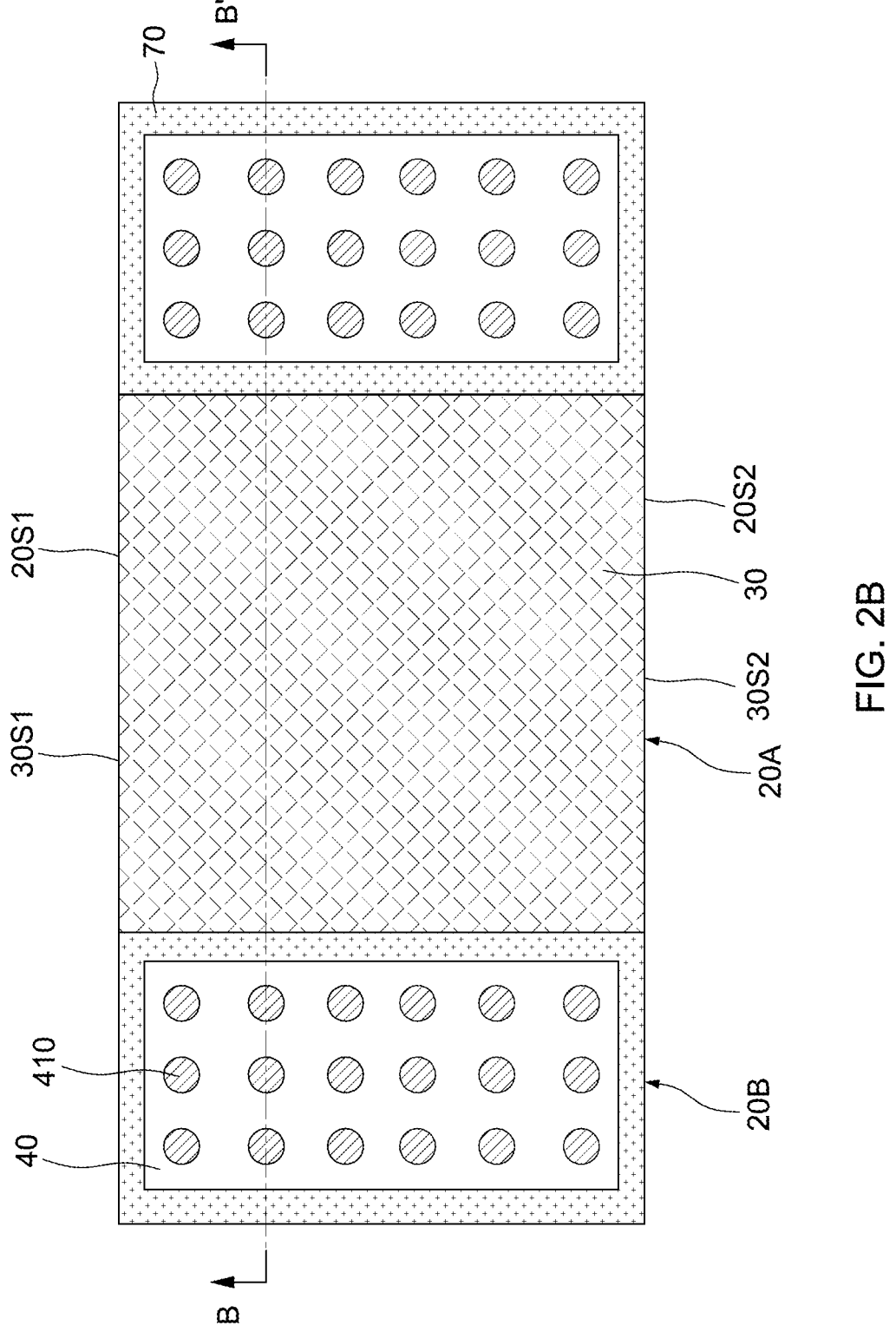
FIG. 2B is a top view of an electronic package in accordance with some embodiments of the present disclosure.

FIG. 2B is a top view of an electronic package in accordance with some embodiments of the present disclosure. In some embodiments, FIG. 2A is a cross-section along the line B-B' in FIG. 2B.

In some embodiments, two connection structures 40 are disposed on opposite sides of the memory unit 30. In some embodiments, the two connection structures 40 are respectively located on the two separate portions of the region 20B of the processing component 20.

According to some embodiments of the present disclosure, a wafer node of the processing element of the processing component 20 is less than or smaller than a wafer node of the active interposer (i.e., the connecting structure 40), and the active interposer is manufactured separately from the processing component 20 and then bonded to the active surface of the processing component 20. Thus, less processing precision is required to manufacture the active interposer than for manufacturing the processing element of the processing component 20, processes requiring different levels of processing precision are performed separately, overall manufacturing process is simplified, and costs are reduced.

In addition, according to some embodiments of the present disclosure, the connection structure 40 may be an I/O element divided from or originating from a monolithic processing unit and configured to replace an I/O element presumably integrated in the processing component 20. Therefore, the volume and/or the device area of the processing component 20 can be further reduced.

Figure 2C:
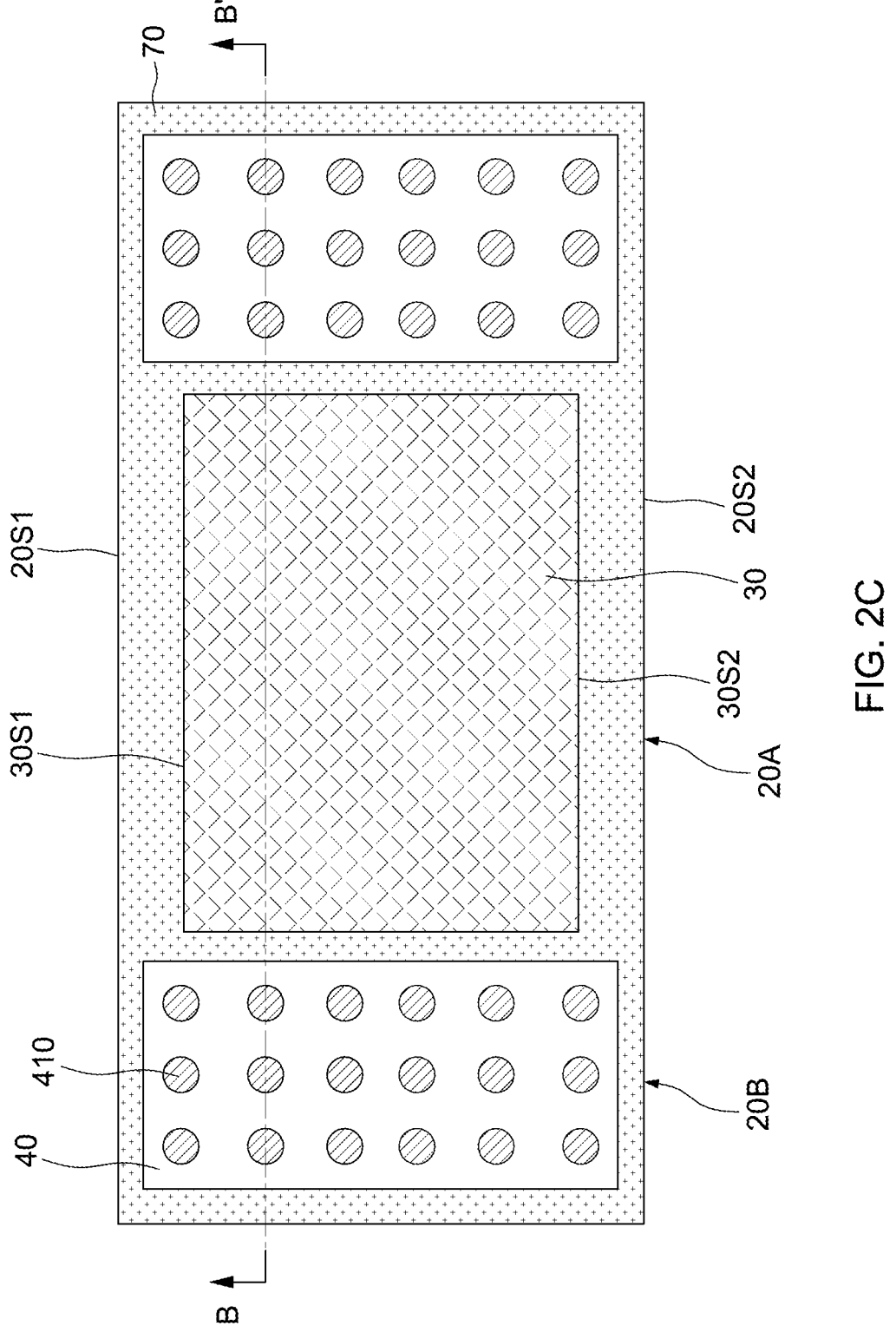
FIG. 2C is a top view of an electronic package in accordance with some embodiments of the present disclosure.

FIG. 2C is a top view of an electronic package in accordance with some embodiments of the present disclosure. In some embodiments, FIG. 2A is a cross-section along the line B-B' in FIG. 2C.

In some embodiments, the edge 20S1 of the processing component 20 is distant or spaced apart from the edge 30S1 of the memory unit 30. In some embodiments, the edge 20S2 of the processing component 20 is distant or spaced apart from the edge 30S2 of the memory unit 30. In some embodiments, a peripheral region of the processing component 20 is uncovered by or exposed from the memory unit 30.

Figure 3A:
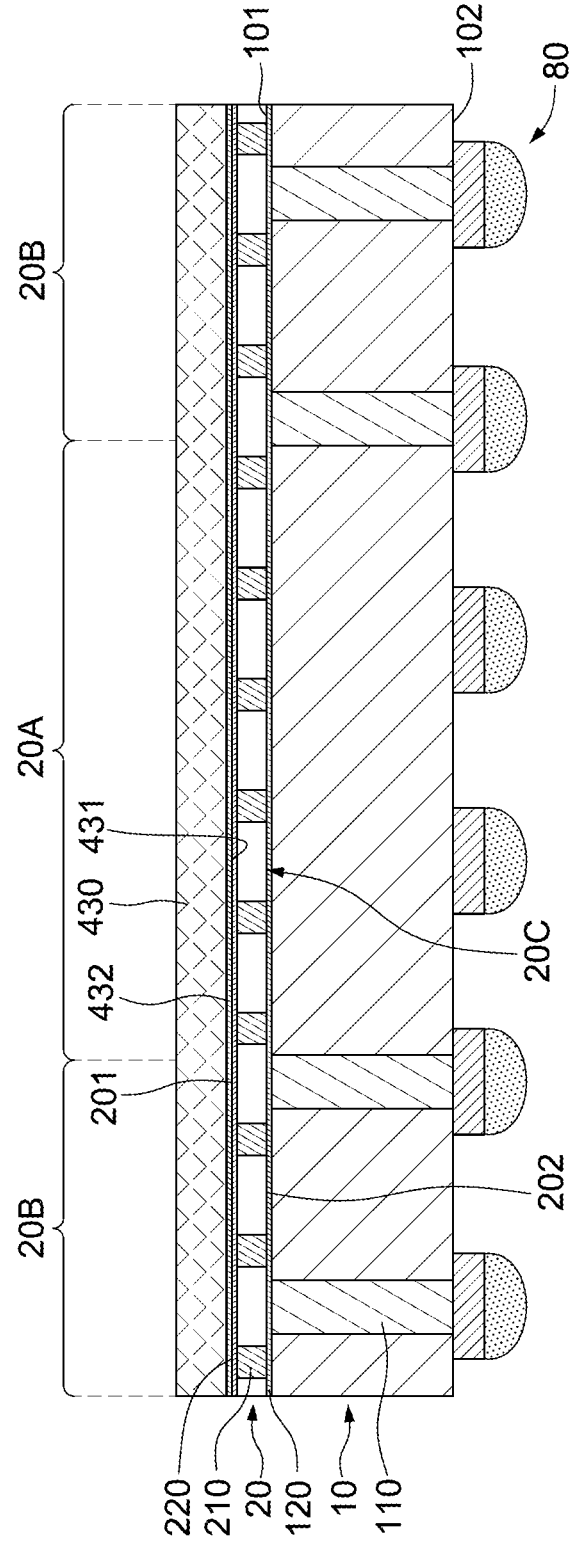
FIG. 3A is a cross-section of an electronic package in accordance with some embodiments of the present disclosure.

FIG. 3A is a cross-section of an electronic package 3 in accordance with some embodiments of the present disclosure. The electronic package 3 is similar to the electronic package 1 shown in FIG. 1A, with differences therebetween as follows. Descriptions of similar components are omitted.

In some embodiments, the electronic package 3 includes an integrated component 430 including a memory element (e.g., the memory unit 30) and an I/O element. In some embodiments, the integrated component 430 covers the regions 20A and 20B of the processing component 20. In some embodiments, an active surface 431 of the integrated component 430 is hybrid-bonded to the surface 201 (or the active surface) of the processing component 20. In some embodiments, the active surface 431 of the integrated component 430 is hybrid-bonded to the regions 20A and 20B of the processing component 20. In some embodiments, the integrated component 430 includes an active element 432 that is hybrid-bonded to the regions 20A and 20B of the processing component 20. In some embodiments, the active element 432 of the integrated component 430 is bonded to the regions 20A and 20B of the processing component 20 through a solder-free joint or a non-solder joint.

In some embodiments, the I/O element of the integrated component 430 is electrically connected to the surface 201 (or the active surface) of the processing component 20. In some embodiments, the memory element of the integrated component 430 is electrically connected to the region 20A, and the I/O element of the integrated component 430 is electrically connected to the region 20B. In some embodiments, the I/O element of the integrated component 430 may be divided from or originating from a monolithic processing unit (e.g., a CPU, a MPU, a GPU, a MCU, an ASIC, or the like). In some embodiments, the memory element of the integrated component 430 may be a cache memory, and the I/O element of the integrated component 430 may be an I/O chiplet. In some embodiments, the I/O element may be an active I/O chiplet. In some embodiments, a wafer node of the processing element of the processing component 20 is less than or smaller than a wafer node of the memory element and a wafer node of the I/O element of the integrated component 430. For example, the memory element and the I/O element of the integrated component 430 may be a 20 nm or more node wafer, such as a 28 nm or more node wafer, a 32 nm or more node wafer, or greater.

Figure 3B:
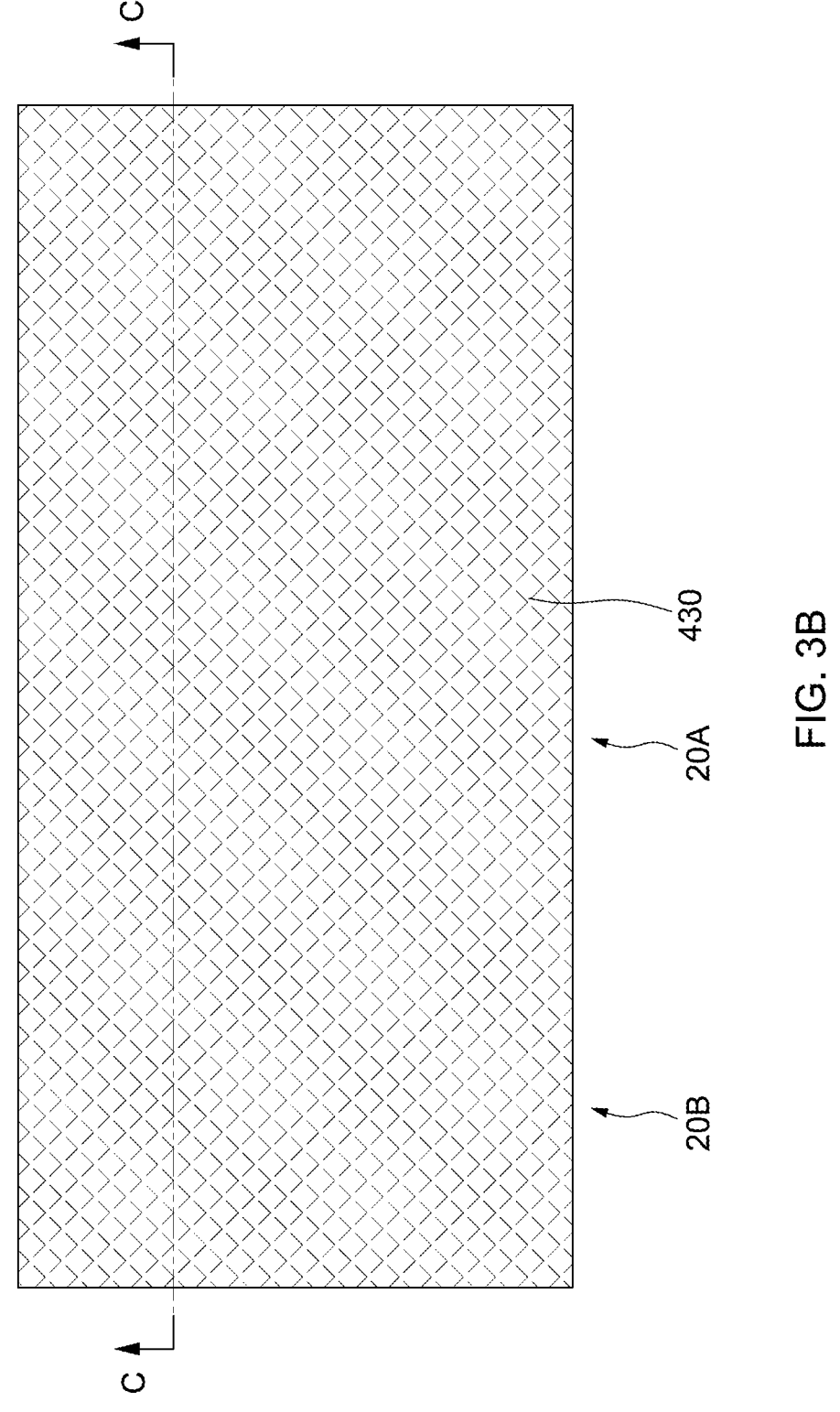
FIG. 3B is a top view of an electronic package in accordance with some embodiments of the present disclosure.

FIG. 3B is a top view of an electronic package 3 in accordance with some embodiments of the present disclosure. In some embodiments, FIG. 3A is a cross-section along the line C-C' in FIG. 3B. In some embodiments, the integrated component 430 covers the regions 20A and 20B of the processing component 20.

According to some embodiments of the present disclosure, the integrated component 430 may be an integrated unit including a memory element and an I/O element, wherein processing precision required for manufacturing the memory element and the I/O element is relatively low compared to that for manufacturing the processing element of the processing component 20. Therefore, the overall manufacturing process is simplified since the processes with relatively low processing precision are integrated to form one integrated component 430, and costs are reduced as well.

Figure 4A:
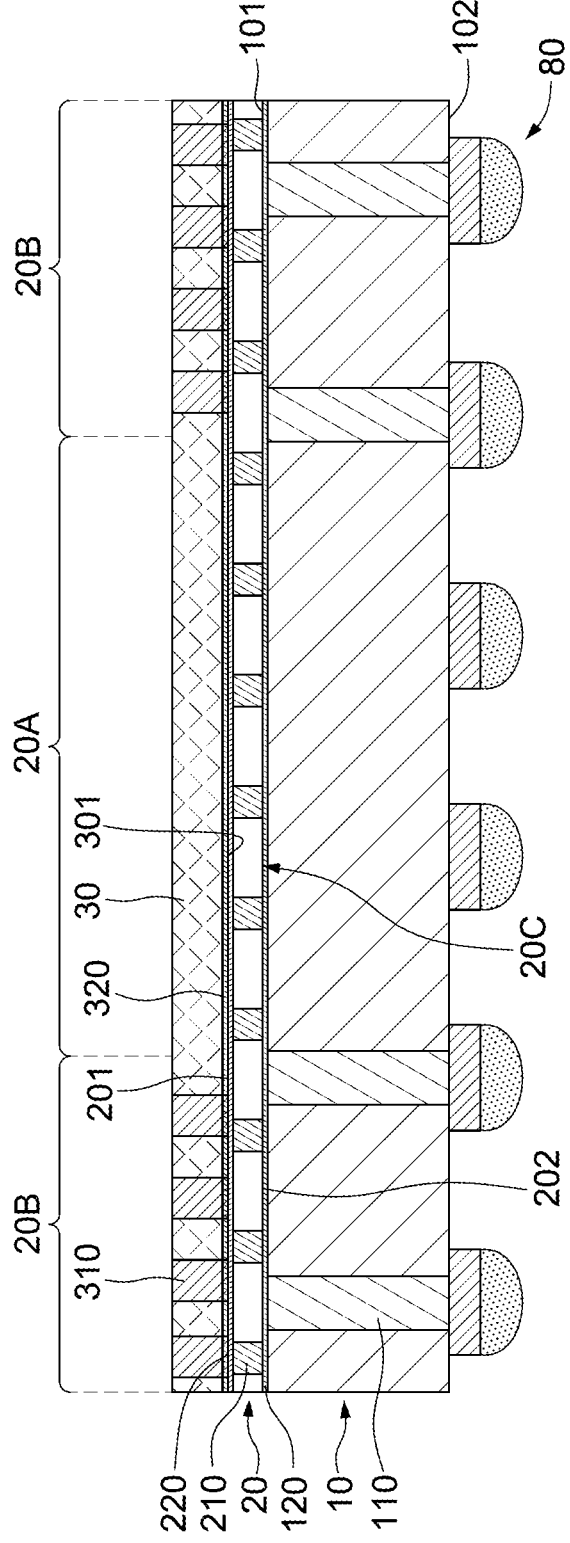
FIG. 4A is a cross-section of an electronic package in accordance with some embodiments of the present disclosure.

FIG. 4A is a cross-section of an electronic package 4 in accordance with some embodiments of the present disclosure. The electronic package 4 is similar to the electronic package 1 shown in FIG. 1A, with differences therebetween as follows. Descriptions of similar components are omitted.

In some embodiments, the memory unit 30 covers the regions 20A and 20B of the processing component 20. In some embodiments, the active surface 301 of the memory unit 30 is hybrid-bonded to the regions 20A and 20B of the processing component 20. In some embodiments, the active element 320 of the memory unit 30 is hybrid-bonded to the regions 20A and 20B of the processing component 20. In some embodiments, the active element 320 of the memory unit 30 is bonded to the regions 20A and 20B of the processing component 20 through a solder-free joint or a non-solder joint.

In some embodiments, the electronic package 4 further includes one or more connection structures 310. In some embodiments, the connection structures 310 pass through the memory unit 30 and electrically connect to the surface 201 (or the active surface) of the processing component 20. In some embodiments, the connection structures 310 pass through or penetrate the memory unit 30 and electrically connect to the region 20B of the processing component 20. In some embodiments, the connection structures 310 and the region 20A of the processing component 20 are non-overlapping in the direction D1. In some embodiments, the connection structures 310 include a plurality of conductive pillars. In some embodiments, the memory unit 30 may be a cache memory, and the connection structure 310 may be conductive pillars passing through or penetrating the cache memory.

Figure 4B:
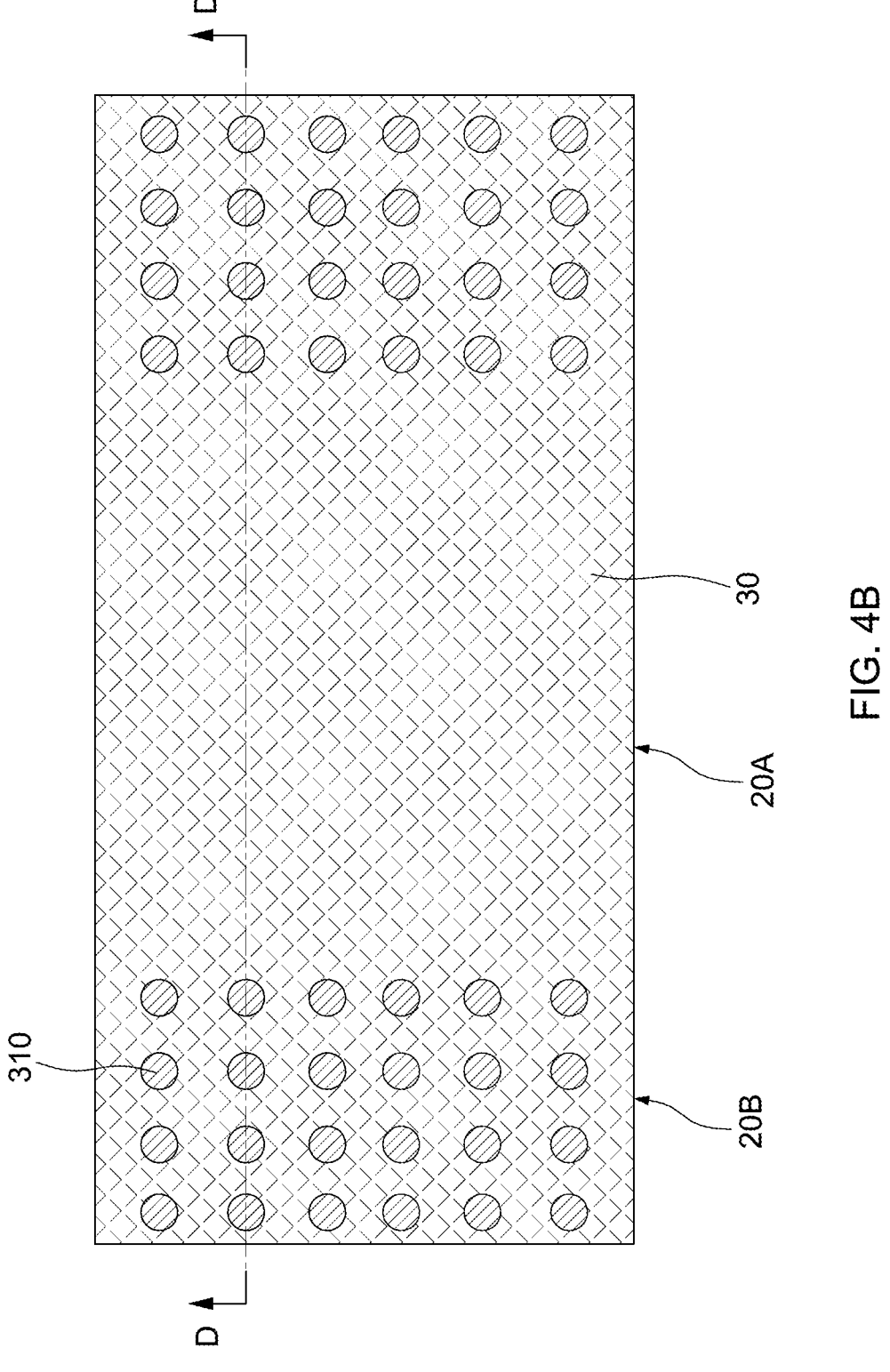
FIG. 4B is a top view of an electronic package in accordance with some embodiments of the present disclosure.

FIG. 4B is a top view of an electronic package in accordance with some embodiments of the present disclosure. In some embodiments, FIG. 4A is a cross-section along the line D-D' in FIG. 4B.

In some embodiments, the connection structures 310 are located on the two portions of the region 20B of the processing component 20. In some embodiments, the connection structures 310 are located on opposite sides of the region 20A of the processing component 20.

Figure 4C:
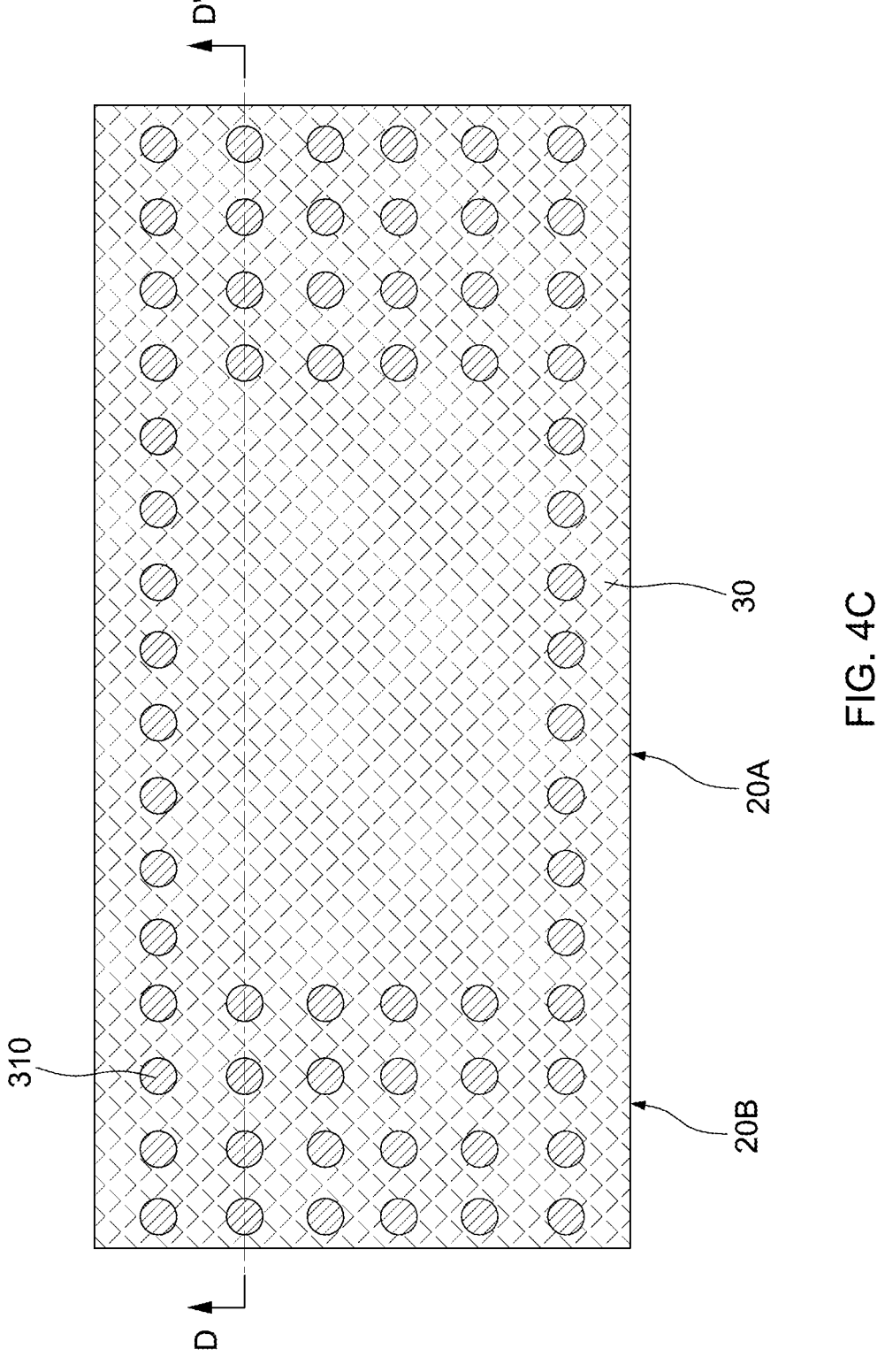
FIG. 4C is a top view of an electronic package in accordance with some embodiments of the present disclosure.

FIG. 4C is a top view of an electronic package in accordance with some embodiments of the present disclosure. In some embodiments, FIG. 4A is a cross-section along the line D-D' in FIG. 4C.

In some embodiments, the connection structures 310 are located adjacent to four edges of the processing component 20. In some embodiments, the connection structures 310 are located adjacent to four edges of the memory unit 30.

Figure 5:
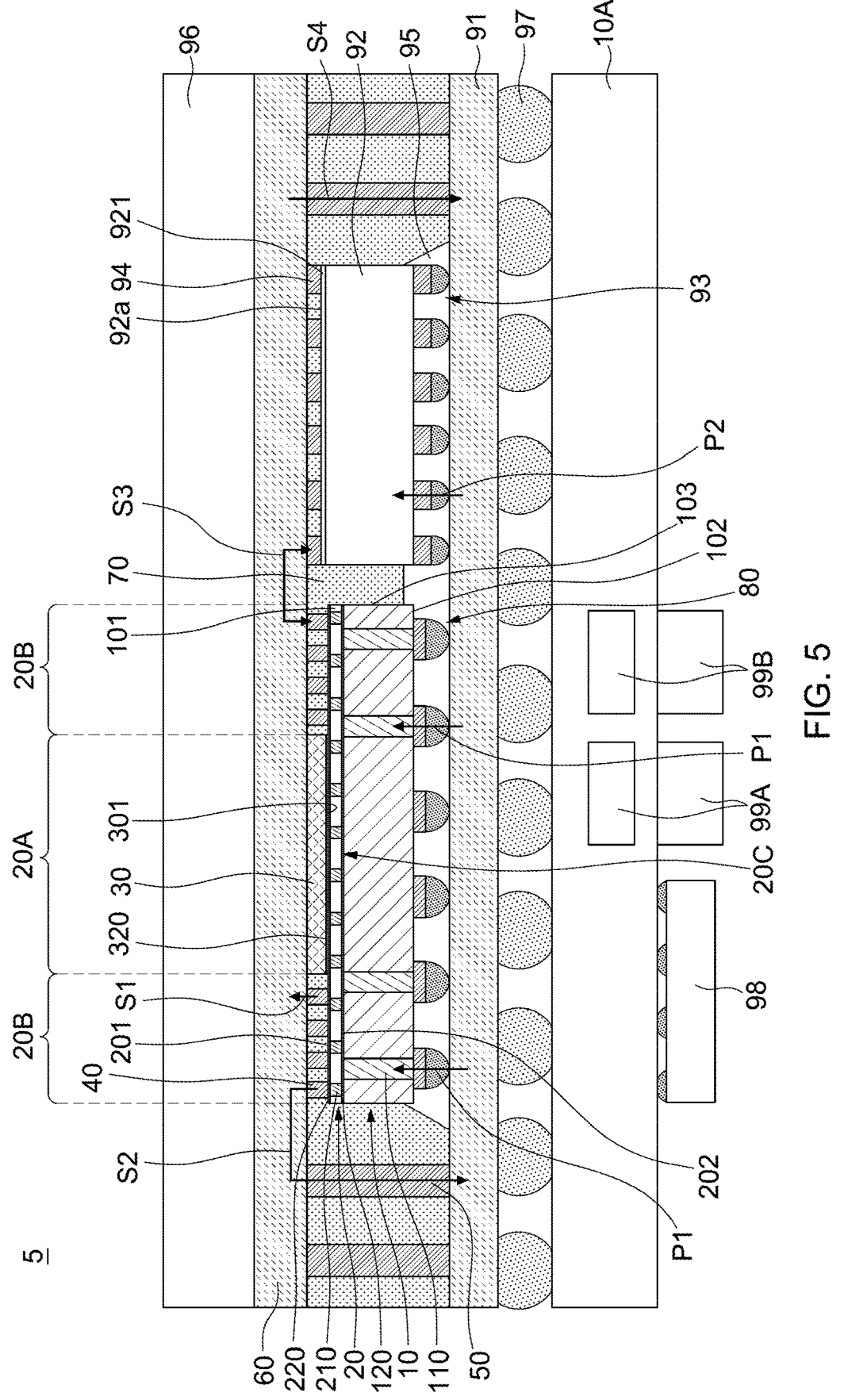
FIG. 5 is a cross-section of an electronic package in accordance with some embodiments of the present disclosure.

FIG. 5 is a cross-section of an electronic package 5 in accordance with some embodiments of the present disclosure. In some embodiments, the electronic package 5 includes a carrier 10, a substrate 10A, a processing component 20, a memory unit 30, connection structures 40, 94, 110, and 210, conductive structures 50, carriers 60 and 91, a protective element 70, electrical contacts 80, 93, and 97, a memory component 92, an underfill 95, a heat dissipation structure 96, and power regulating components 98, 99A, and 99B. The electronic package 5 has a structure that is similar to the electronic package 1 shown in FIG. 1A, with differences therebetween as follows. Descriptions of similar components are omitted.

In some embodiments, the combination of the processing component 20 (or the processing unit), the memory unit 30 (or the storage unit), and the connection structure 40 may be referred to as an assembly structure. The protective element 70 may encapsulate the assembly structure. The conductive structure 50 may extend along a lateral side of the assembly structure and connect the carrier 60 and the carrier 91.

In some embodiments, the region 20A of the processing component 20 is configured to provide an electrical connection within the electronic package 5. In some embodiments, the region 20B of the processing component 20 is configured to provide an electrical connection external to the electronic package 5. In some embodiments, the surface 202 (or the backside surface) of the processing component 20 is configured to receive power for the processing component 20. In some embodiments, the processing component 20 is configured to receive a power signal from the carrier 91. In some embodiments, the processing component 20 is configured to receive the power signal from the carrier 91 into the processing component 20. In some embodiments, the processing component 20 is configured to receive the power signal from the carrier 91 into the processing component 20 through one or more power paths P1. In some embodiments, the memory unit 30 is stacked on the processing component 20.

In some embodiments, the conductive structure 50 is disposed adjacent to the processing component 20 and electrically connected to the region 20A of the surface 201 of the processing component 20. In some embodiments, the carrier 10 is configured to transmit power to the surface 202 of the processing component 20, and the conductive structure 50 extends along a lateral surface 103 of the carrier 10. In some embodiments, the conductive structure 50 is or includes a conductive pillar.

In some embodiments, the carrier 60 is disposed over the carrier 91. In some embodiments, the carrier 60 is over the processing component 20 and electrically connected to the surface 201 thereof. In some embodiments, the carrier 60 is electrically connected to the surface 201 of the processing component 20 through the connection structure 40. In some embodiments, the carrier 60 is over the processing component 20 and the conductive structure 50. In some embodiments, the carrier 60 is electrically connected to the conductive structure 50. In some embodiments, the carrier 60 is configured to provide interconnection between the conductive structure 50 and the region 20B of the processing component 20.

In some embodiments, the connection structure 40 extends along a lateral side of the memory unit 30 and configured to transmit a non-power signal (e.g., a digital signal) from the processing component 20 to the carrier 60. In some embodiments, the connection structure 40 is configured to transmit the non-power signal (e.g., the digital signal) from the processing component 20 to the carrier 60 through a signal path S1. In some embodiments, the connection structure 40 is configured to transmit a non-power signal (e.g., a digital signal) from the processing component 20 to the carrier 91 through a signal path S2. In some embodiments, a digital signal is transmitted from the carrier 60 to the carrier 91 through a signal path S4. In some embodiments, the carrier 60 is configured to provide the electrical connection external to the electronic package 5. In some embodiments, the carrier 60 may be or include an interconnection structure, such as an RDL.

In some embodiments, the carrier 10 is disposed on the electrically connected to the carrier 91. In some embodiments, the carrier 10 is electrically connected to the carrier 91 through the electrical contacts 80. In some embodiments, the connection structure 110 passes through the carrier 10 and is configured to transmit the power signal. In some embodiments, the carrier 91 may be or include an interconnection structure, such as an RDL.

In some embodiments, the memory component 92 is disposed on and electrically connected to the carrier 91. In some embodiments, the memory component 92 is electrically connected to the carrier 91 through the electrical contacts 93. In some embodiments, the memory component 92 includes an active element 921 (e.g., a circuit region) adjacent to an active surface 92a of the memory component 92. In some embodiments, the memory component 92 is electrically connected to the carrier 60 through the connection structures 94. In some embodiments, the memory component 92 may be or include a high bandwidth memory (HBM). In some embodiments, the memory component 92 is configured to receive a power signal from the carrier 91 into the memory component 92 through one or more power paths P2. In some embodiments, a digital signal is transmitted between the processing component 20 and the memory component 92 through a signal path S3. In some embodiments, the electrical contacts 93 include solder balls, e.g., C4 bump, a BGA, or a LGA. In some embodiments, the connection structures 94 include conductive pads or conductive vias.

In some embodiments, the underfill 95 covers the electrical contacts 80 and 93. In some embodiments, the underfill 95 further covers a portion of the carrier 10 and a portion of the memory component 92. In some embodiments, the protective element 70 covers or encapsulates the memory component 92. In some embodiments, the protective element 70 covers or encapsulates the connection structures 40 and 94, the conductive structures 50, and the underfill 95.

In some embodiments, the carrier 91 is bonded to the substrate 10A. In some embodiments, the carrier 91 is electrically connected to the substrate 10A through the electrical contacts 97. In some embodiments, the electrical contacts 97 include solder balls, e.g., C4 bump, a BGA, or a LGA.

The substrate 10A may include, for example, a printed circuit board, such as a paper-based copper foil laminate, a composite copper foil laminate, or a polymer-impregnated glass-fiber-based copper foil laminate. The substrate 10A may include an interconnection structure, such as a plurality of conductive traces or a through via. In some embodiments, the substrate 10A includes a ceramic material or a metal plate. In some embodiments, the substrate 10A may include an organic substrate or a leadframe. In some embodiments, the substrate 10A may include a two-layer substrate which includes a core layer and a conductive material and/or structure disposed on an upper surface and a bottom surface of the substrate 10A. The conductive material and/or structure may include a plurality of traces.

In some embodiments, the power regulating component 98 may be disposed on the substrate 10A and/or integrated within the substrate 10A. In some embodiments, the power regulating components 99A and 99B may be disposed on the substrate 10A and/or integrated within the substrate 10A. The power regulating component 98 may include a voltage regulating element, such as a linear regulator or a switching regulator. The power regulating component may include a step-down (buck) converter, a step-up (boost) converter, an analog-to-digital converter, a digital-to-analog converter, an AC-DC converter, a DC-DC converter, other types of converters, or a combination thereof. The power regulating components 99A and 99B may be or include one or more passive components, such as one or more inductance devices (or inductors) and/or one or more capacitance devices (or capacitors). The power regulating components 99A and 99B may further include one or more passive devices including, for example, resistors, diodes, fuses, antifuses, etc. In some embodiments, the power regulating components 99A are inductors, and the power regulating components 99B are capacitors.

In some embodiments, the heat dissipation structure 96 is disposed on the carrier 60. In some embodiments, the heat dissipation structure 96 includes a heat sink.

FIG. 6A, FIG. 6B, FIG. 6C, FIG. 6D, FIG. 6E, and FIG. 6F illustrate various stages of a method of manufacturing an electronic package 1 in accordance with some embodiments of the present disclosure.

Figure 6A:
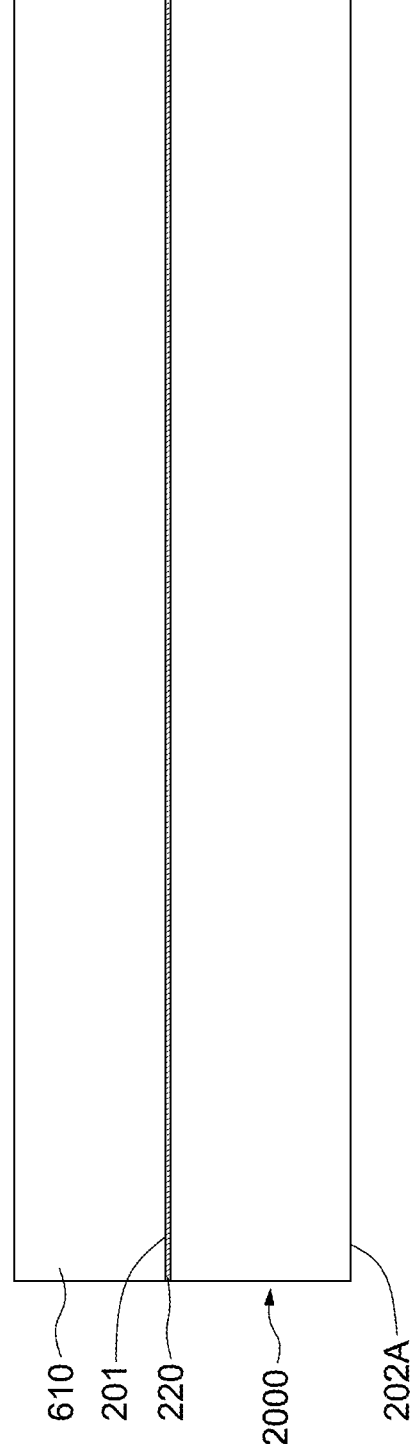
FIG. 6A, FIG. 6B, FIG. 6C, FIG. 6D, FIG. 6E, and FIG. 6F illustrate various stages of a method of manufacturing an electronic package in accordance with some embodiments of the present disclosure.

Referring to FIG. 6A, a processing component 2000 may be bonded to a carrier 610. In some embodiments, the processing component 2000 has an active surface (e.g., surface 201) that is bonded to the carrier 610. In some embodiments, the processing component 2000 includes an active element 220 bonded to the carrier 610.

Figure 6B:
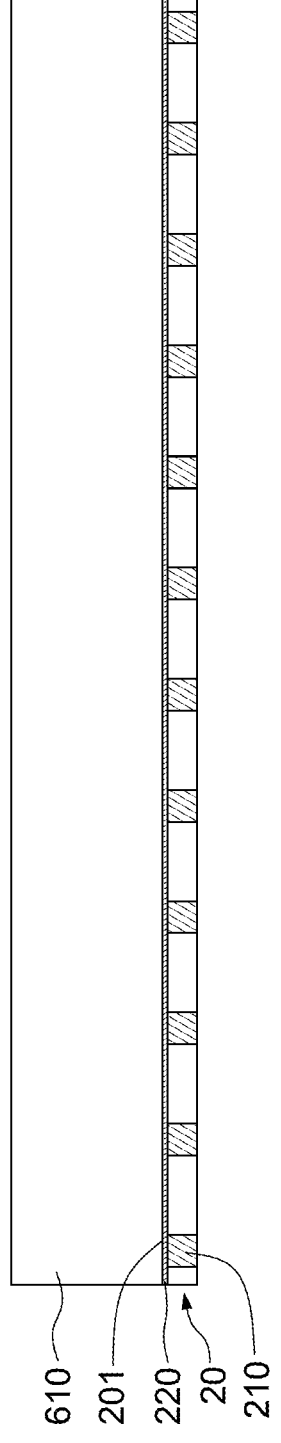

Referring to FIG. 6B, a portion of the processing component 2000 may be removed to form a thinned processing component 20, and connection structures 210 may be formed passing through or penetrating the processing component 20. In some embodiments, the processing component 2000 has a backside surface 202A opposite the surface 201, and a grinding operation may be performed on the processing component 2000 from the backside surface 202A to form the thinned processing component 20. In some embodiments, a plurality of vias are formed passing through or penetrating the processing component 20, e.g., by drilling. In some embodiments, a conductive material is filled in the vias, e.g., by plating, to form the connection structures 210.

Figure 6C:
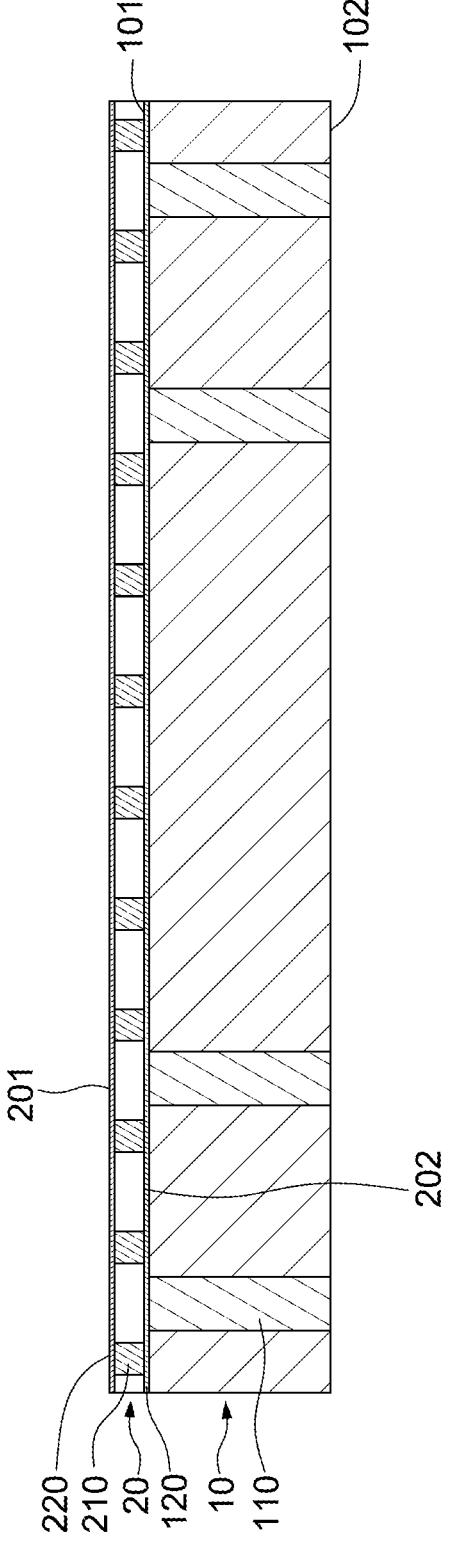

Referring to FIG. 6C, a carrier 10 may be hybrid-bonded to the processing component 20, and the carrier 610 may be removed. The thinned processing component 20 may have a backside surface 202 opposite the surface 201. In some embodiments, the backside surface 202 of the thinned processing component 20 may be hybrid-bonded to the carrier 10. In some embodiments, connection structures 110 are formed to pass through or penetrate the carrier 10 before it is hybrid-bonded to the processing component 20. In some embodiments, the carrier 10 includes a conductive layer 120 (e.g., a redistribution layer (RDL) or a circuit region) adjacent to a surface 101 of the carrier 10, and the conductive layer 120 is hybrid-bonded to the backside surface 202 of the processing component 20.

Figure 6D:
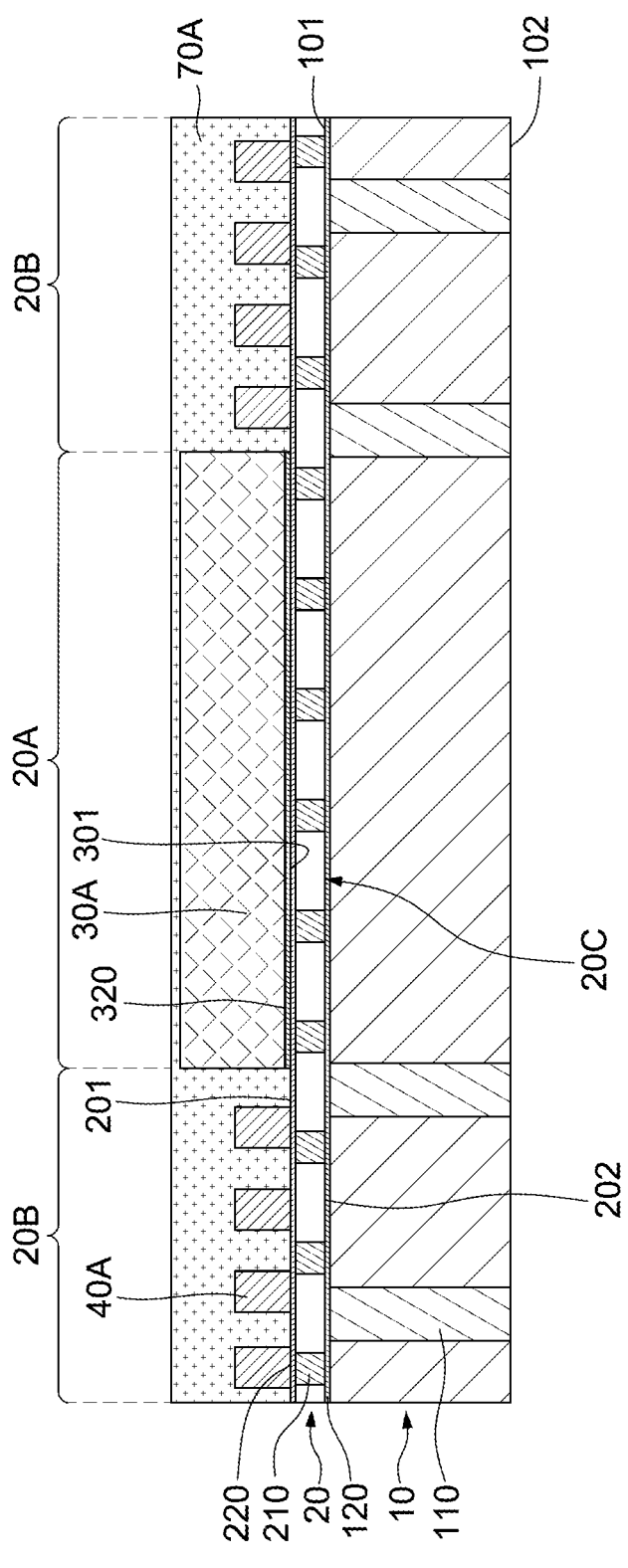

Referring to FIG. 6D, a memory unit 30A may be bonded to a region 20A of the surface 201 of the processing component 20, connection structures 40A may be formed on a region 20B of the surface 201 of the processing component 20, and a protective element 70A may be formed to cover or encapsulate the memory unit 30A and the connection structures 40A. In some embodiments, the memory unit 30A is hybrid-bonded to the region 20A of the surface 201 of the processing component 20. In some embodiments, the memory unit 30A and the connection structures 40A are entirely covered by the protective element 70A.

Figure 6E:
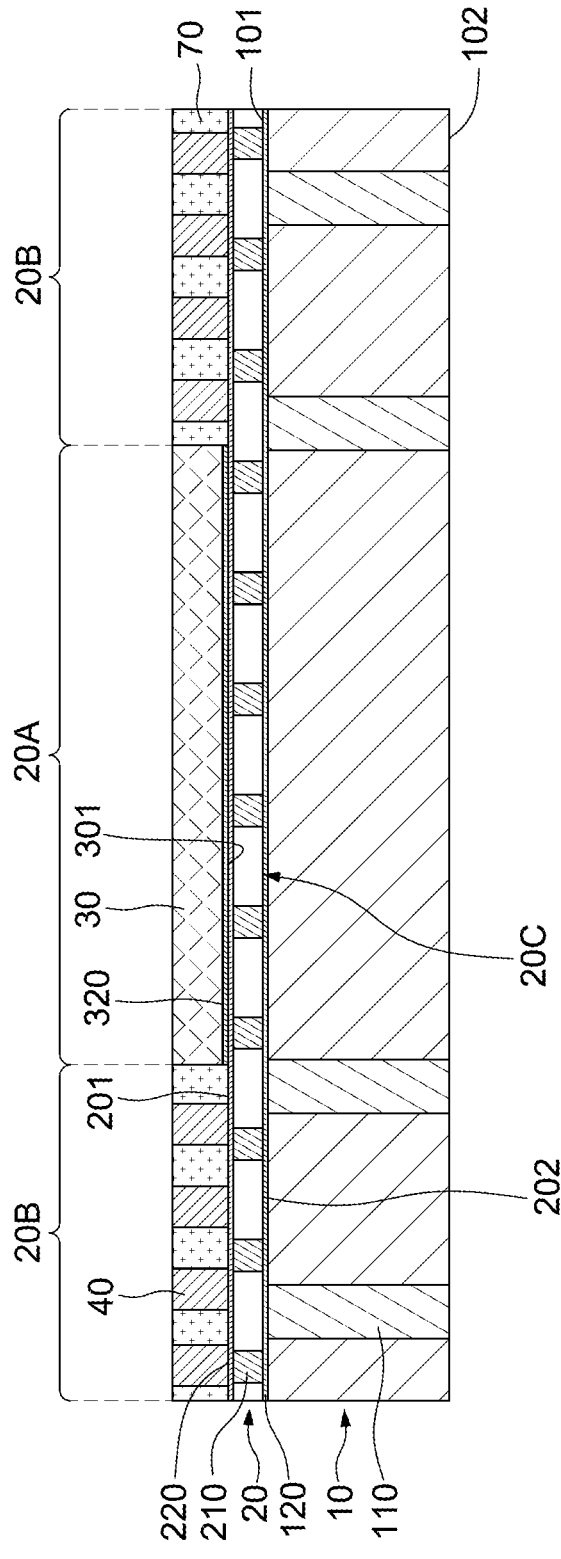

Referring to FIG. 6E, a removal operation may be performed to remove a portion of the protective element 70A, a portion of the memory unit 30A, and a portion of the connection structures 40A. In some embodiments, the removal operation may be performed by grinding. In some embodiments, an upper surface of the memory unit 30, and upper surfaces of the connection structures 40 are exposed by the protective element 70 after the removal operation.

Figure 6F:
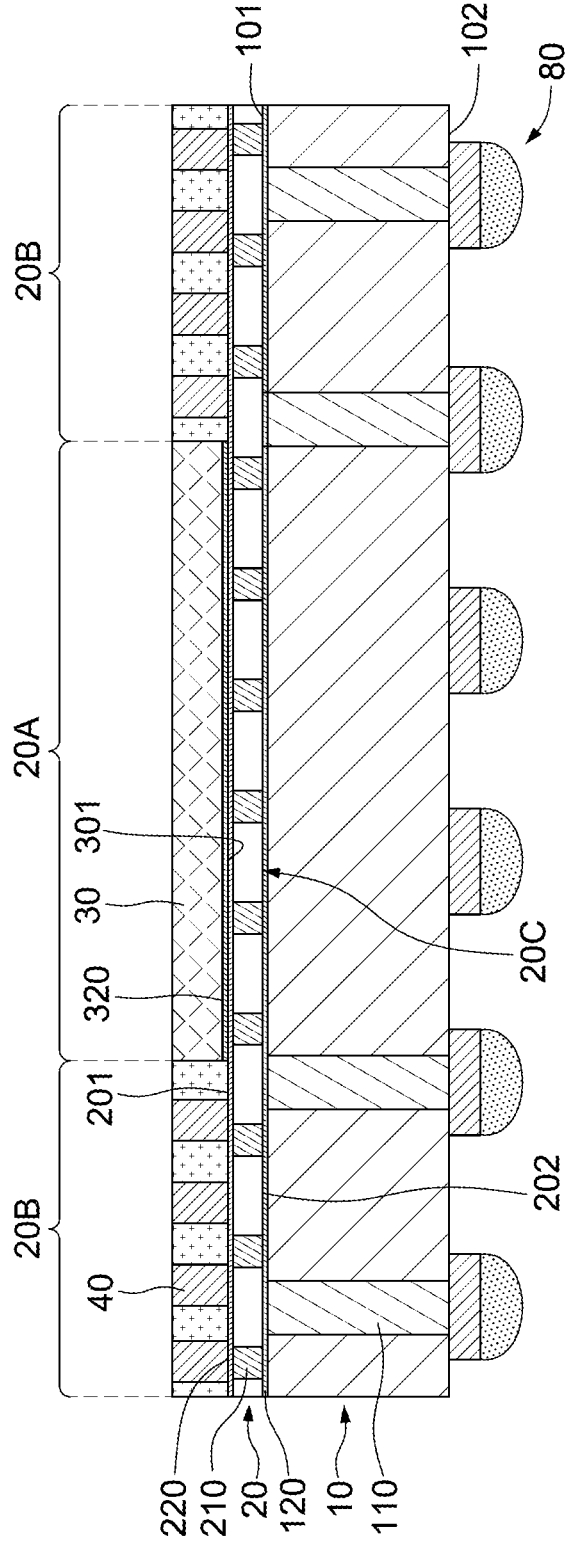

Referring to FIG. 6F, electrical contacts 80 may be formed on a surface 102 opposite the surface 101 of the carrier 10. In some embodiments, a temporary carrier (not shown in drawings) may be bonded to the protective element 70 serving as a support for forming the electrical contacts 80 on the surface 102 of the carrier 10, and the temporary carrier may be removed after the electrical contacts 80 are formed. As such, the electronic package 1 is formed.

Figure 7A:
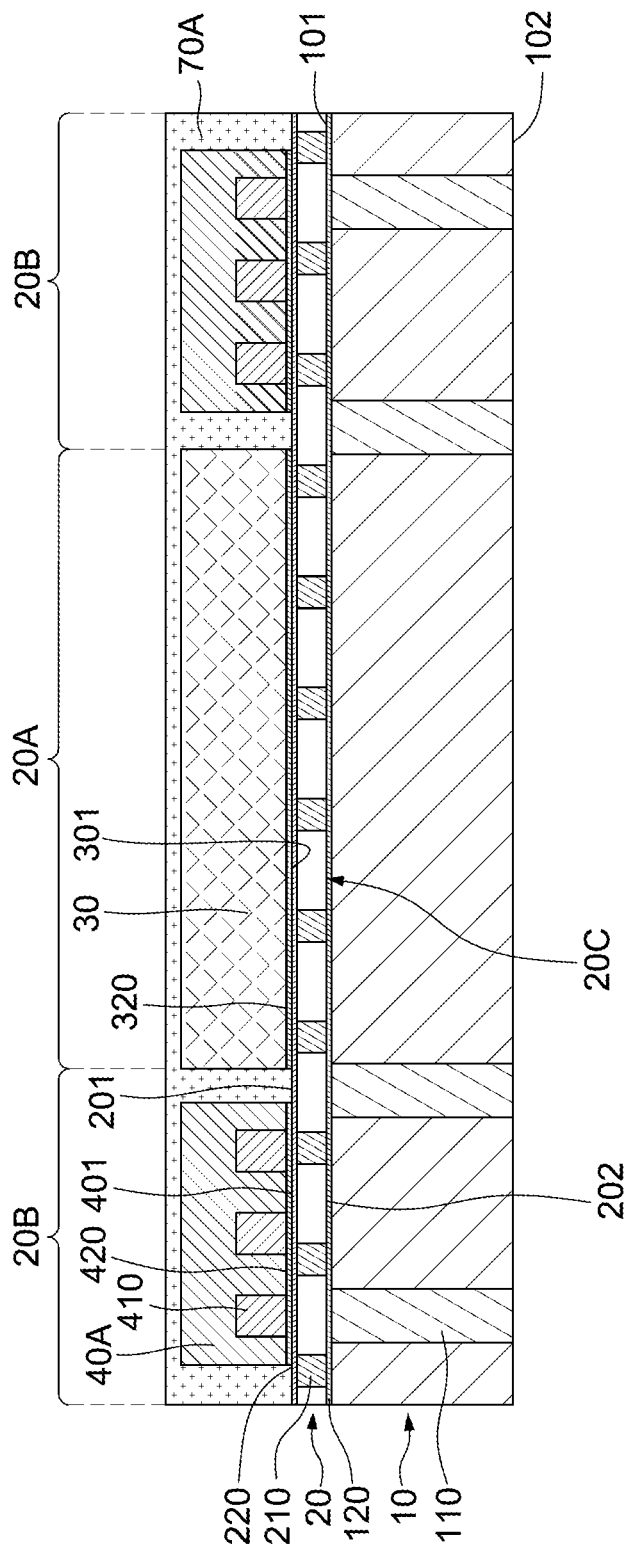
FIG. 7A, FIG. 7B, and FIG. 7C illustrate various stages of a method of manufacturing an electronic package in accordance with some embodiments of the present disclosure.
Figure 7B:
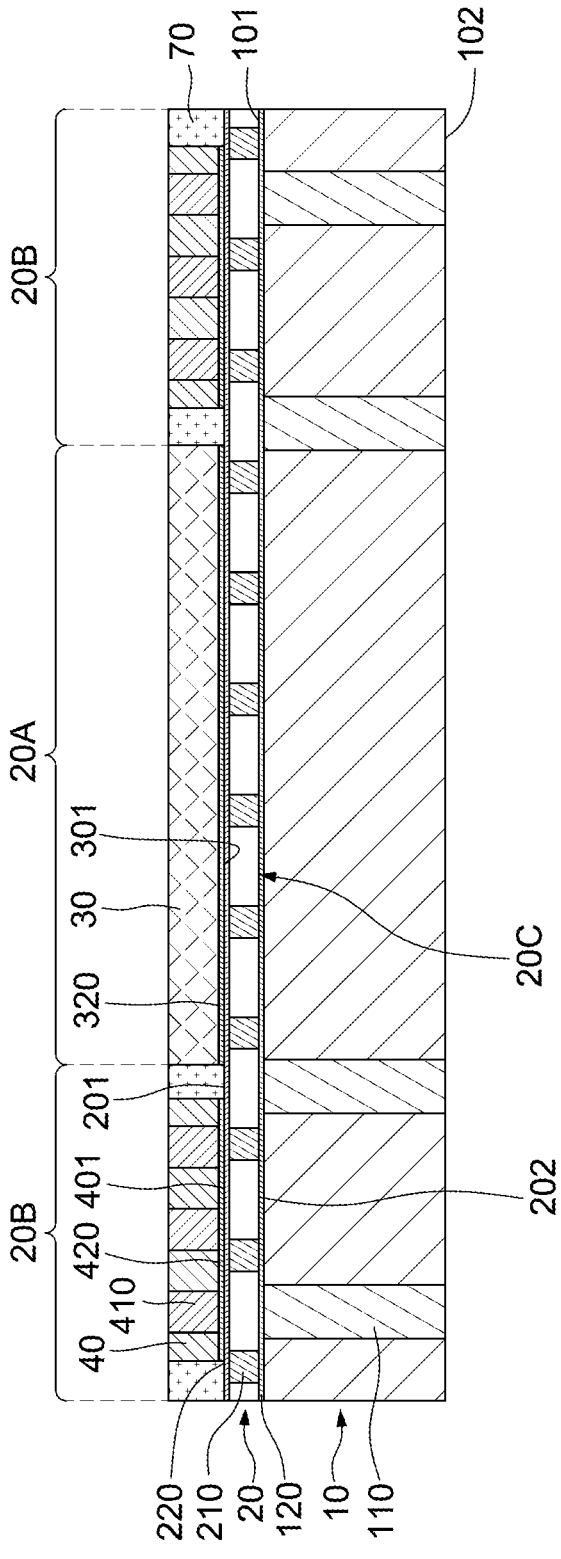
Figure 7C:
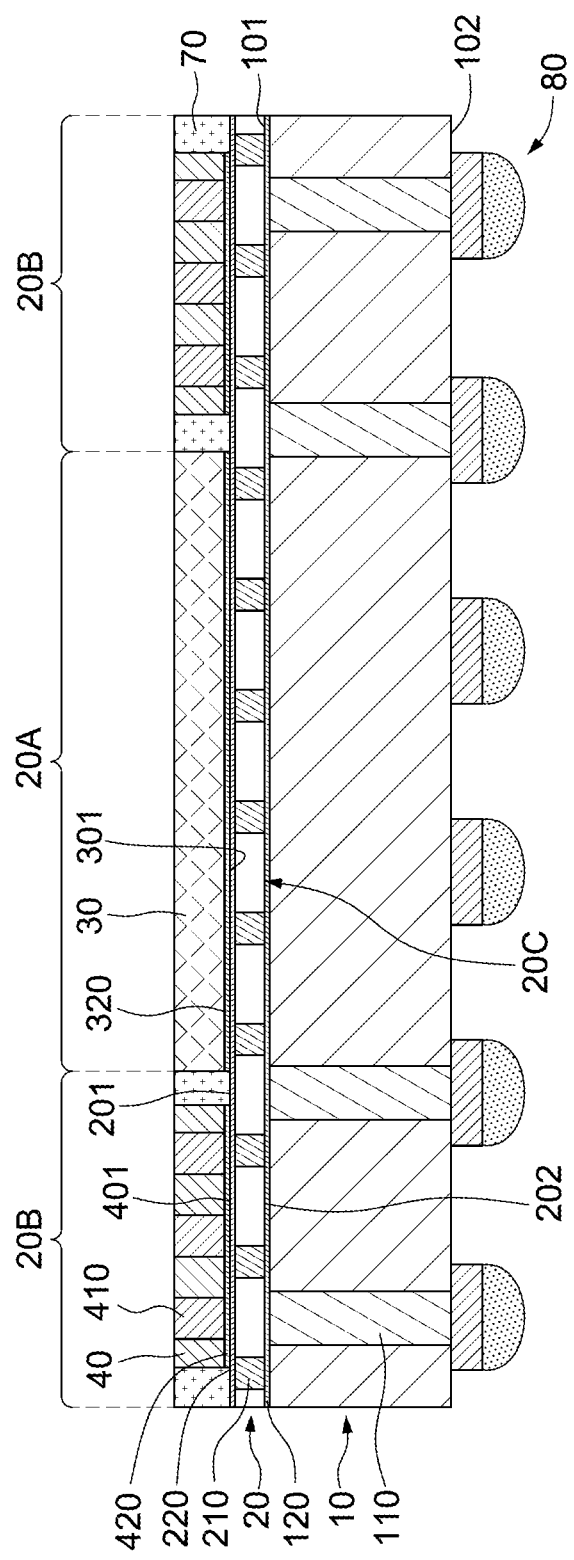

FIG. 7A, FIG. 7B, and FIG. 7C illustrate various stages of a method of manufacturing an electronic package 2 in accordance with some embodiments of the present disclosure.

Referring to FIG. 7A, operations similar to those illustrated in FIGS. 6A-6C may be performed to form a structure as shown in FIG. 6C, a memory unit 30A may be bonded to a region 20A of the surface 201 of the processing component 20, connection structures 40A may be formed on a region 20B of the surface 201 of the processing component 20, and a protective element 70A may be formed to cover or encapsulate the memory unit 30A and the connection structures 40A. In some embodiments, the memory unit 30A is hybrid-bonded to the region 20A of the surface 201 of the processing component 20. In some embodiments, the memory unit 30A and the connection structures 40A are entirely covered by the protective element 70A.

In some embodiments, the connection structure 40A includes a silicon-based body, conductive pillars 410 passing through or penetrating the silicon-based body, and an active element 420 adjacent to a surface 401 (also referred to as "an active surface") of the connection structure 40A. In some embodiments, the connection structure 40A is hybrid-bonded to the region 20B of the surface 201 of the processing component 20. In some embodiments, the active element 420 of the connection structure 40A is hybrid-bonded to the region 20B of the surface 201 of the processing component 20.

Referring to FIG. 7B, a removal operation may be performed to remove a portion of the protective element 70A, a portion of the memory unit 30A, and a portion of the connection structures 40A. In some embodiments, the removal operation may be performed by grinding. In some embodiments, an upper surface of the memory unit 30, and upper surfaces of the conductive pillars 410 of the connection structures 40 are exposed by the protective element 70 after the removal operation.

Referring to FIG. 7C, electrical contacts 80 may be formed on a surface 102 opposite the surface 101 of the carrier 10. In some embodiments, a temporary carrier (not shown in drawings) may be bonded to the protective element 70 serving as a support for forming the electrical contacts 80 on the surface 102 of the carrier 10, and the temporary carrier may be removed after the electrical contacts 80 are formed. As such, the electronic package 2 is formed.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of said numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" or "about" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately 104 S/m, such as at least 105 S/m or at least 106 S/m. The electrical conductivity of a material can sometimes vary with temperature. Unless otherwise specified, the electrical conductivity of a material is measured at room temperature.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component. In the description of some embodiments, a component provided "under" or "below" another component can encompass cases where the former component is directly below (e.g., in physical contact with) the latter component, as well as cases where one or more intervening components are located between the former component and the latter component.

While the present disclosure has been described and illustrated with reference to specific embodiments thereof, these descriptions and illustrations do not limit the present disclosure. It can be clearly understood by those skilled in the art that various changes may be made, and equivalent components may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and the like. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. An electronic package, comprising:
a processing component having a first side comprising a first region and a second region distinct from the first region, wherein the processing component has a third region at a second side opposite to the first side;
a memory unit disposed over the first region, wherein the first region is configured to provide interconnection between the processing component and the memory unit, and the second region is configured to provide external connection;
a first connection structure on the second region and electrically connected to the processing component, wherein the first connection structure extends along a lateral side of the memory unit;
a second connection structure on the third region and electrically connected to the processing component, wherein a diameter of the second connection structure is greater than a diameter of the first connection structure; and
a carrier supporting the processing component, wherein the second connection structure passes through the carrier.

2. The electronic package of claim 1, wherein the memory unit covers the first region and does not cover the second region.

3. The electronic package of claim 2, wherein the first region separates the second region into two portions.

4. The electronic package of claim 3, wherein the second region surrounds the first region.

5. The electronic package of claim 1, wherein a digital signal is transmitted between the processing component and the memory unit, and between the first region and the second region of the processing component.

6. The electronic package of claim 5, wherein the third region is configured to receive a power into the processing component.

7. The electronic package of claim 6, wherein the processing component comprises an active surface and a passive surface opposite to the active surface, and the first region and the second region are closer to the active surface than to the passive surface.

8. The electronic package of claim 1, wherein the carrier comprises a voltage regulating element and a power path configured to transmit a power passing through the second connection structure, the voltage regulating element, and the processing component.

9. An electronic package, comprising:
a processing component having a first surface and a second surface opposite to the first surface, wherein the processing component is configured to transmit a digital signal through the first surface and receive a power through the second surface;
a memory unit adjacent to the first surface of the processing component;
a first connection structure extending from the second surface toward the first surface and configured to transmit the power; and
a second connection structure on the first surface and configured to transmit the digital signal.

10. The electronic package of claim 9, wherein the second connection structure extends along at least two lateral sides of the memory unit.

11. The electronic package of claim 9, wherein the processing component comprises a first edge and a second edge, and the memory unit extends from the first edge toward the second edge.

12. An electronic package, comprising:
a first carrier;
a second carrier disposed over the first carrier; and
an assembly structure disposed between the first carrier and the second carrier, the assembly structure comprising:

a processing unit configured to receive a power signal from the first carrier into the processing unit;

a storage unit stacked on the processing unit; and a first connection structure extending along a lateral side of the storage unit and configured to transmit a non-power signal from the processing unit to the second carrier.

13. The electronic device of claim 12, wherein the assembly structure comprises:

a third carrier disposed between the processing unit and the first carrier; and a second connection structure passing through the third carrier and configured to transmit the power signal.

14. The electronic package of claim 13, further comprising a protective element configured to encapsulate the assembly structure.

15. The electronic package of claim 12, further comprising a conductive structure extending along at least a lateral side of the assembly structure and connecting the first carrier and the second carrier.

\* \* \* \* \*